United States Patent
Dauth

(10) Patent No.: US 6,509,769 B2
(45) Date of Patent: Jan. 21, 2003

(54) CLOCK SIGNAL GENERATOR/CONVERTER DEVICE

(75) Inventor: Fritz-Jörg Dauth, Holzkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 86 days.

(21) Appl. No.: 09/734,463

(22) Filed: Dec. 11, 2000

(65) Prior Publication Data

US 2002/0030518 A1 Mar. 14, 2002

(30) Foreign Application Priority Data

Dec. 10, 1999 (DE) .......................... 199 59 714

(51) Int. Cl.[7] ................................ H03L 7/06
(52) U.S. Cl. ...................... 327/156; 327/147
(58) Field of Search .................. 327/156, 147, 327/115, 117, 145, 141, 162

(56) References Cited

U.S. PATENT DOCUMENTS

| | | | | |
|---|---|---|---|---|
| 4,348,769 A | * | 9/1982 | Kittel ......................... | 341/143 |
| 4,608,699 A | * | 8/1986 | Batlivala et al. ............ | 375/216 |
| 4,651,102 A | * | 3/1987 | Inbar ......................... | 327/116 |
| 5,790,601 A | * | 8/1998 | Corrigan et al. ............ | 332/100 |
| 6,218,876 B1 | * | 4/2001 | Sung et al. .................. | 326/93 |
| 6,275,990 B1 | * | 8/2001 | Dapper et al. .............. | 375/260 |

FOREIGN PATENT DOCUMENTS

| | | |
|---|---|---|
| DE | 2 300 704 | 7/1974 |
| DE | 39 41 642 A1 | 6/1990 |
| DE | 39 26 072 A1 | 2/1991 |
| EP | 0 367 065 A1 | 5/1990 |

OTHER PUBLICATIONS

International Patent Application No. 94/18441 (Bestenreiner), dated Aug. 18, 1994.
"Forward error correction for submarine systems", ITU–G.975, Nov. 1996, pp. 1–5.

* cited by examiner

*Primary Examiner*—Kenneth B. Wells
*Assistant Examiner*—Cassandra Cox
(74) *Attorney, Agent, or Firm*—Laurence A. Greenberg; Werner H. Stemer; Ralph E. Locher

(57) ABSTRACT

The device converts a clock signal into a second clock signal having a different clock rate. This allows converting a first data signal into a second data signal having an altered data rate. Controlling the frequency dividers particularly in the feedback path of the phase-locked loops enables matching to the different data rates and conversion between both data signals DS1 into DS2, or DS2 into DS1.

14 Claims, 3 Drawing Sheets

CLOCK SIGNAL GENERATOR/CONVERTER DEVICE

BACKGROUND OF THE INVENTION

Field of the Invention

The invention relates to a clock signal generator/converter device with the aid of which a first data signal is converted into a second data signal having a different data rate.

For data transmission protected by error correction, the data rate can be increased. At the receiving end, the original data signal can be recovered from the transmitted signal.

Thus, for example for the transmission of SDH signals (synchronous digital hierarchy) via submarine cables according to ITU-G. 975, it has recommended to introduce an error correction, for which purpose the transmission rate is increased to 15/14 of the original data rate. The use of the corresponding devices will be explained with reference to FIG. 1. From a subscriber, a first data signal is transmitted in a first access network AN1. As early as here it may be necessary to use a first regenerator R1. The latter forwards a regenerated data signal which is transmitted in an optical network ON in a manner protected with the aid of correction bits. In the converter terminal TT, firstly an assigned clock signal is obtained from the data signal DS and the clock signal is converted into a clock signal having a higher data rate, which corresponds to the transmission rate of a second data signal DS2 having correction bits. A further regenerator R2 may be necessary for amplitude, pulse-shape and clock regeneration in the optical network. In the reconverter terminal TR, firstly an assigned second clock signal is obtained from the data signal DS2 and converted into a first clock signal TS1, which is again assigned to the recovered first data signal DS1.

SUMMARY OF THE INVENTION

The object of the invention is to provide a suitable clock signal generator/converter device, in particular for the transmission terminal and the reception terminal, which overcomes the above-noted deficiencies and disadvantages of the prior art devices and methods of this general kind. The device is also intended to be useable in the regenerators.

With the above and other objects in view there is provided, in accordance with the invention, a clock signal generator/converter device, comprising:

- a first phase-locked loop for obtaining a first clock signal from a respective one of a plurality of data signals having mutually different data rates, the first phase-locked loop receiving a respective data signal as a reference signal;
- the first phase-locked loop having a feedback path with a first adjustable frequency divider for coarse matching to the different data rates;
- a frequency divider connected to receive the first clock signal;
- a second phase-locked loop connected to receive the first clock signal as a second reference signal via the frequency divider, the second phase-locked loop converting the first clock signal into an assigned second clock signal having a different clock frequency;
- the second phase-locked loop having a feedback path with a second adjustable frequency divider for coarse matching to the different data rates of the data signals and with a third frequency divider for generating the second clock signal having the different clock frequency.

The possibility of changeover means that the novel device can be used universally. This is the essential advantage of the device. Additional advantages and features are found in the following summary.

In accordance with an added feature of the invention, a third frequency divider is connected in the feedback path of the second phase-locked loop, and the third frequency divider and the frequency divider connected between the first and second phase-locked loops are adjustable to selectively set an increase and a reduction in the clock rate of the second clock signal relative to a clock rate of the first clock signal.

In accordance with an additional feature of the invention, a further frequency divider having a fractional rational division ratio is connected in the feedback path of the second phase-locked loop.

In accordance with another feature of the invention, the division ratio of the further frequency divider is adjustable for selectively setting an increase and a reduction in the clock frequency of the second clock signal relative to a clock frequency of the first clock signal.

In accordance with a further feature of the invention, the further frequency divider is a fifth frequency divider, and a sixth frequency divider is connected downstream of the fifth frequency divider in a signal flow direction.

In accordance with again an added feature of the invention, the frequency divider in the feedback path of the second phase-locked loop is additionally adjustable to set the clock frequency of the first clock signal identical to the clock frequency of the second clock signal.

In accordance with again an additional feature of the invention, a controller is connected to and configured to adjust the frequency dividers, the controller containing information concerning the data rate of the first data signal/the clock rate of the first clock signal and the data rate of the second data signal/the clock rate of the second clock signal.

In accordance with again another feature of the invention, the data rate of the first data signal is determined by a frequency discriminator of the first phase-locked loop and a controller, and the first frequency divider of the first phase-locked loop is adjusted accordingly, and wherein the second phase-locked loop is adjusted on a basis of additional information, which may be stored or transmitted.

In accordance with a concomitant feature of the invention, there are provided identical controllable oscillators in the first and second phase-locked loops.

Other features which are considered as characteristic for the invention are set forth in the appended claims.

Although the invention is illustrated and described herein as embodied in a clock signal generator/converter device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
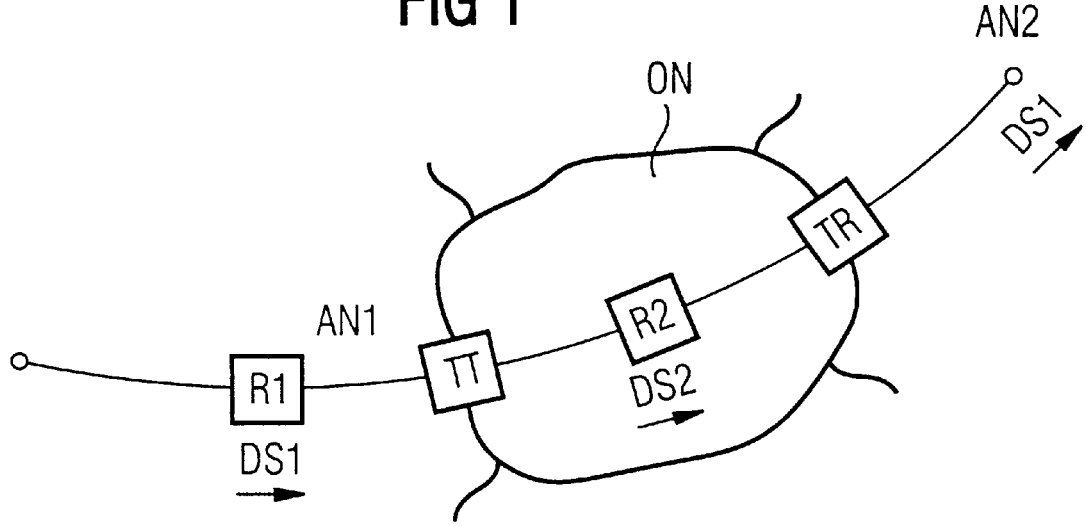
FIG. 1 is a diagram of an application of the invention.

The device according to the invention is intended to be used, as already explained in the above introductory text in the description with reference to FIG. 1, in particular at the interfaces between unprotected optical networks AN1, AN2 and an optical network ON which is protected by error correction (and can be monitored in synchronous digital hierarchy, SDH, networks by means of an OH byte.

Figure 2:
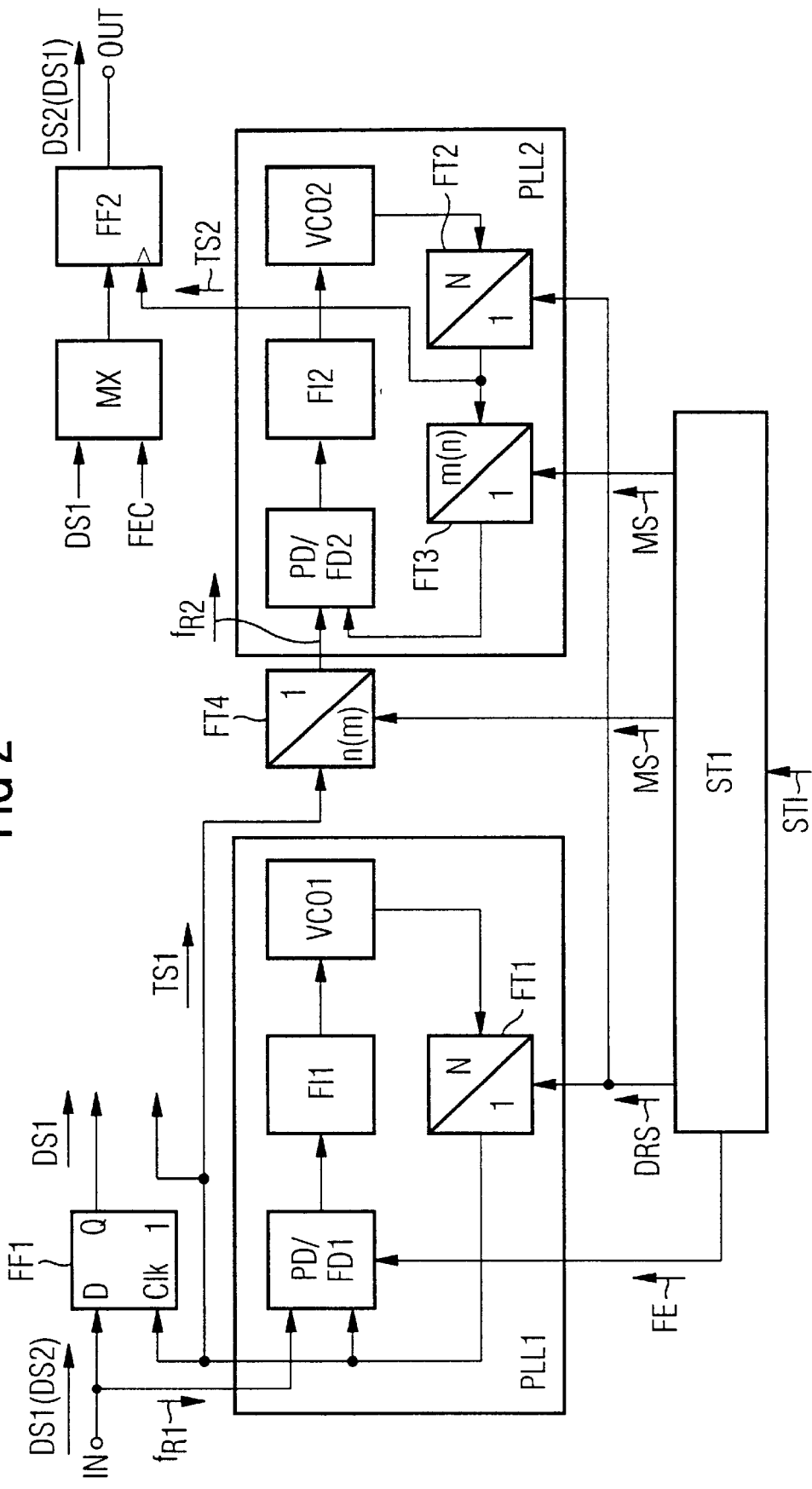
FIG. 2 is a schematic block diagram of a first exemplary embodiment of the invention.

Referring now to the figures of the drawing showing the novel device in detail and first, particularly, to FIG. 2 thereof, there is seen a clock signal generator/converter device according to the invention. It essentially contains two phase-locked loops PLL1 and PLL2 and also a controller ST1. The first phase-locked loop PLL1 contains a phase/frequency discriminator PD/FD1, a filter FI1, a first controllable oscillator VCO1 and, in the feedback circuit, an adjustable first frequency divider FT1. A first data signal DS1 is fed as reference signal $f_{R1}$ to the phase/frequency discriminator PD/FD1 via an input. Moreover, the discriminator can be tuned by a frequency adjusting signal FE. The first frequency divider FT1 is adjusted in accordance with the data rate of the data signal DS1 by means of a data rate control signal DRS from the controller ST1, which receives control information STI from the network management. This frequency divider enables the circuit to be used at a wide variety of data rates. By virtue of the phase/frequency discriminator PD/FD1, reliable lock-on of the first phase-locked loop PLL1 is achieved and the first clock signal TS1 is generated. With the latter, the data signal DS1 is buffer-stored in a sampling flip-flop FF1.

The second phase-locked loop PLL2 receives the first clock signal TS1 or a signal derived therefrom by frequency division as second reference signal $f_{R2}$. This second phase-locked loop PLL2 is intended firstly to supply a somewhat increased data rate. For this purpose, a second frequency divider FT2 and a third frequency divider FT3 are arranged in the feedback circuit. The second frequency divider FT2 has the same division ratio as the first frequency divider FT1 and is adjusted together with the latter in accordance with the data rate of the data signal DS1 present. The third frequency divider FT3 has a division ratio of m:1, while the frequency divider FT4 which is connected upstream of the second phase/frequency discriminator PD/FD2 has a division ratio of n:1. Consequently, in accordance with the division ratio m:n, in this case 15:14, a second clock signal TS2 having an increased clock rate is generated. With this clock signal, the buffer-stored data of the first data signal DS1 and additional correction bits FEC are combined by means of a multiplexer and output via a transmission flip-flop FF2 as second data signal DS2. If the third frequency divider FT3 and the frequency divider FT4 connected upstream are made adjustable, then the clock frequency of the second clock signal TS2 can remain identical or be increased or decreased relative to the first clock frequency TS1. In the application specified, the same device can be utilized for converting a second data signal DS2 in a reception terminal TR (FIG. 1) into a first data signal DS1 (a buffer store that is required is not illustrated). For this purpose, it is necessary merely to interchange the division ratios of the frequency dividers FT3 and FT4. If both division ratios are identical, the device can be used as a regenerator.

Figure 3:
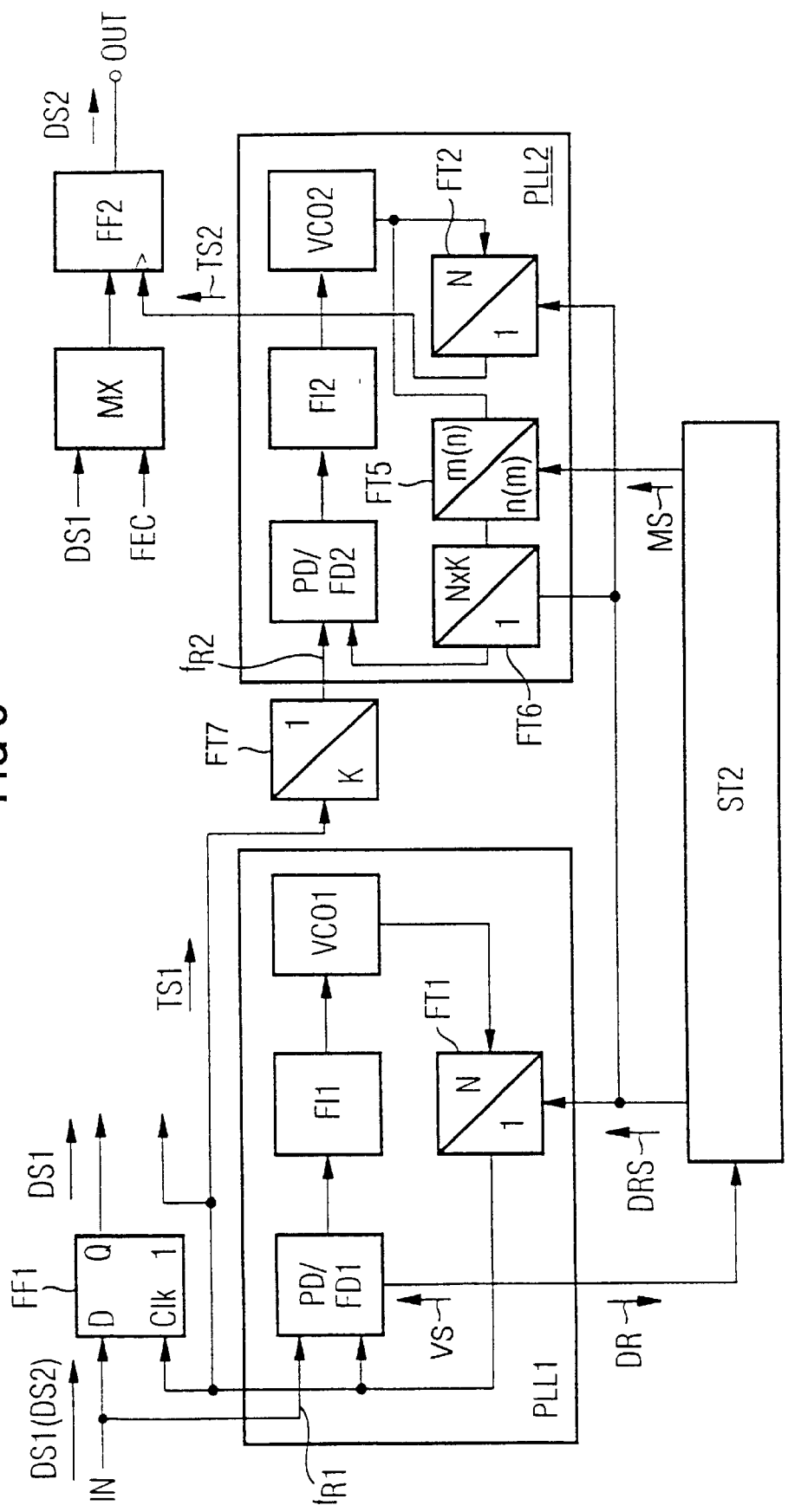
FIG. 3 is a schematic block diagram of a second exemplary embodiment.

Referring now to FIG. 3, there is illustrated a variant of the second phase-locked loop. Here, the recovery is effected with the aid of a fifth frequency divider FT5, which has a fractional rational division ratio m:n or n:m. This frequency divider is connected together with a sixth frequency divider FT6 into the feedback path of the phase-locked loop. The sixth frequency divider has a division ratio of (N×K):1 and can be adjusted by the mode control signal MS. The second reference signal $f_{R2}$ is obtained by means of a frequency divider FT7 connected upstream and having the division ratio K:1. The frequency divider FT6 is expedient for compensating the sudden phase changes caused by the fractional rational frequency divider FT5. Depending on the division ratios m:n and N:1, it may be possible to dispense with frequency division by the factor K and thus also with the frequency divider FT7 connected upstream. The second clock signal is obtained once again with the aid of the frequency divider FT2.

A variant ST2 of the controller is provided here which has no information about the data rate of the received data signal. This is determined by the phase/frequency discriminator with the aid of an external reference signal VS. The further adjustment is effected in the manner already described, depending on whether the data rate is intended to be increased or decreased.

I claim:

1. A clock signal generator/converter device, comprising:
   a first phase-locked loop for obtaining a first clock signal from a respective one of a plurality of data signals having mutually different data rates, said first phase-locked loop receiving a respective data signal as a first reference signal;
   said first phase-locked loop having a feedback path with a first adjustable frequency divider for coarse matching to the different data rates;
   a frequency divider connected to receive the first clock signal and generating a second reference signal from the first clock signal;
   a second phase-locked loop connected to receive the second reference signal from said frequency divider, said second phase-locked loop converting the second reference signal into an assigned second clock signal having a different clock frequency;
   said second phase-locked loop having a feedback path with a second adjustable frequency divider for generating the second clock signal, and a third adjustable frequency divider connected in said feedback path of said second phrase-locked loop; and
   said second and third adjustable frequency dividers and said frequency divider connected between said first and second phase-locked loops being adjustable to selectively set an increase and a reduction in the clock rate of the second clock signal relative to a clock rate of the first clock signal.

2. The device according to claim 1, wherein said adjustable frequency dividers in said feedback path of said second phase-locked loop are additionally adjustable to set the clock frequency of the first clock signal identical to the clock frequency of the second clock signal.

3. The device according to claim 1, which comprises identical controllable oscillators in said first and second phase-locked loops.

4. The device according to claim 1, which comprises a controller connected to and configured to adjust said frequency dividers, said controller containing information concerning the data rate of the first data signal/the clock rate of the first clock signal and the data rate of the second data signal/the clock rate of the second clock signal.

5. The device according to claim 4, wherein the data rate of the first data signal is determined by a frequency discriminator of said first phase-locked loop and said controller, and said first frequency divider of said first phase-locked loop is adjusted accordingly on a basis of additional information.

6. The device according to claim 5, wherein the additional information is stored or received by said controller.

7. A clock signal generator/converter device, comprising:
   a first phase-locked loop for obtaining a first clock signal from a respective one of a plurality of data signals having mutually different data rates, said first phase-locked loop receiving a respective data signal as a first reference signal;
   said first phase-locked loop having a feedback path with a first adjustable frequency divider for coarse matching to the different data rates;
   a frequency divider connected to receive the first clock signal and generating a second reference signal from the first clock signal;
   a second phase-locked loop connected to receive the second reference signal from said frequency divider, said second phase-locked loop converting the second reference signal into an assigned second clock signal having a different clock frequency;
   said second phase-locked loop having a second adjustable frequency divider for generating the second clock signal; and
   said second phase-locked loop having a feedback path with a further adjustable frequency divider, the division ratio of said further adjustable frequency divider being adjustable for selectively setting an increase and a reduction in the clock rate of the second clock signal relative to a clock rate of the first clock signal.

8. The device according to claim 7, wherein said further frequency divider has a fractional rational division ratio.

9. The device according to claim 7, which comprises a controller connected to and configured to adjust said frequency dividers, said controller containing information concerning the data rate of the first data signal/the clock rate of the first clock signal and the data rate of the second data signal/the clock rate of the second clock signal.

10. The device according to claim 7, wherein said second frequency divider is connected to a controllable oscillator of the second phase-locked loop and not arranged in said feedback path of said second phase-locked loop.

11. The device according to claim 9, wherein the data rate of the first data signal is determined by a frequency discriminator of said first phase-locked loop and said controller, and said first frequency divider of said first phase-locked loop is adjusted accordingly on a basic of additional information.

12. The device according to claim 11, wherein the additional information is stored or received by said controller.

13. The device according to claim 7, which comprises identical controllable oscillators in said first and second phase-locked loops.

14. The device according to claim 7, wherein said further frequency divider includes a fifth frequency divider, and a sixth frequency divider connected downstream of said fifth frequency divider in a signal flow direction.

* * * * *